United States Patent
Otake

[11] 4,057,739
[45] Nov. 8, 1977

[54] ELECTRO-CHROMIC DISPLAY DRIVING CIRCUIT

[75] Inventor: Tsutomu Otake, Suwa, Japan

[73] Assignee: Kabushiki Kaisha Suwa Seikosha, Tokyo, Japan

[21] Appl. No.: 691,694

[22] Filed: June 1, 1976

[30] Foreign Application Priority Data
May 29, 1975 Japan .................. 50-64581

[51] Int. Cl.² ........................................... H03K 17/00
[52] U.S. Cl. .................................. 307/270; 307/251; 340/336; 350/160R
[58] Field of Search ............. 307/270, 251, 304; 340/336, 324 R; 58/23; 350/160 R

[56] References Cited
U.S. PATENT DOCUMENTS

| | | | |
|---|---|---|---|
| 3,751,682 | 8/1973 | Howe | 307/270 |
| 3,828,547 | 8/1974 | Fujita | 340/336 |
| 3,938,318 | 2/1976 | Collins | 340/336 |
| 3,988,616 | 10/1976 | Shimada | 307/270 |

Primary Examiner—Stanley D. Miller, Jr.
Assistant Examiner—B. P. Davis
Attorney, Agent, or Firm—Blum, Moscovitz, Friedman & Kaplan

[57] ABSTRACT

An improved display driving circuit for driving an electro-chromic display cell is provided. The electro-chromic display cell is formed of a first conductor adapted to be referenced to a first potential and a second conductor spaced apart from the first conductor and adapted to be referenced to either a second potential or a third potential. An oxidation-reduction sensitive compound is disposed between the first and second spaced apart conductors. The compound is normally at a first level of transparency in response to a first predetermined potential difference between the first potential and the second potential and is altered to a second level of transparency in response to a second predetermined potential difference between the third potential and the first potential. An injection type transistor circuit alternately and successively applies a second potential and third potential to the second conductor to produce a transient characterized by an initial sharp increase and a subsequent slower decrease in current across the first and second conductors the transient being produced by the second predetermined potential difference.

9 Claims, 12 Drawing Figures

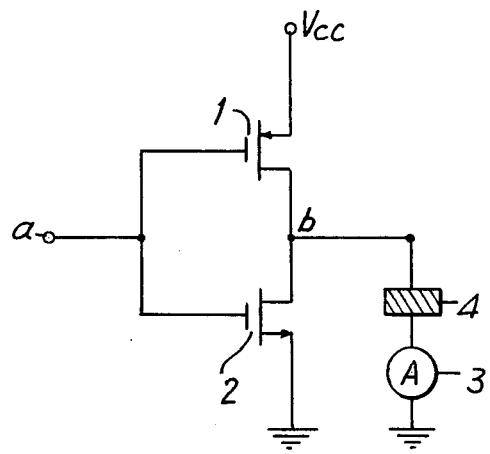
FIG.1
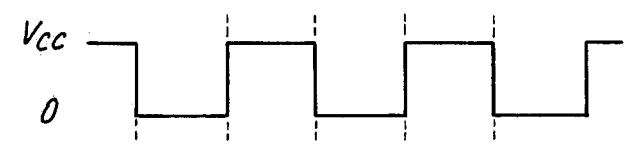
FIG.2a
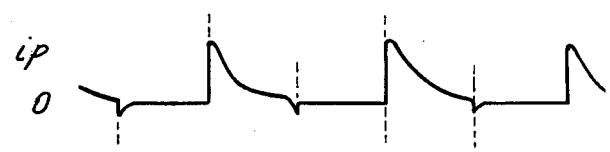
FIG.2b
FIG.2c
FIG.2d

FIG. 6
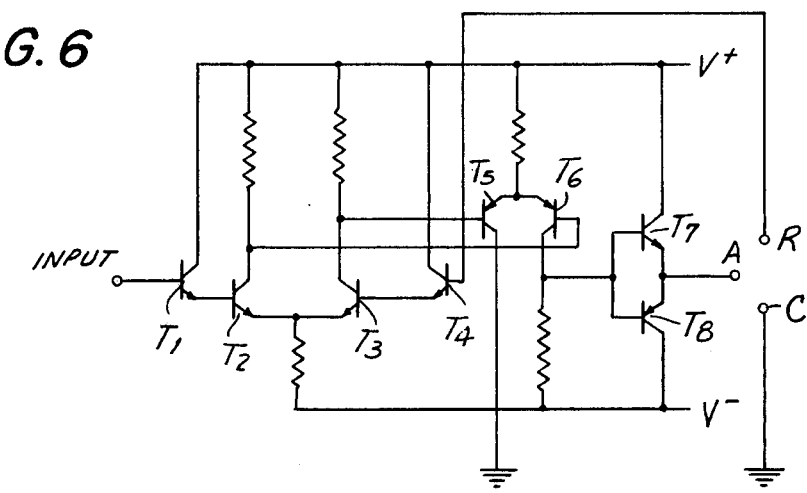
FIG. 7a
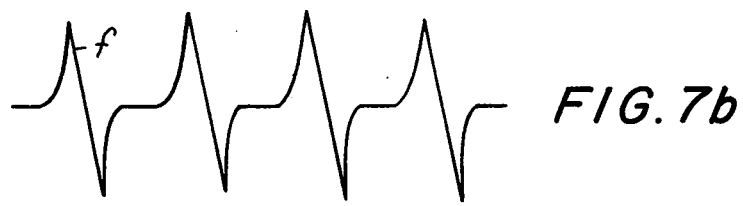
FIG. 7b

ELECTRO-CHROMIC DISPLAY DRIVING CIRCUIT

BACKGROUND OF THE INVENTION

This invention is directed to an electro-chromic display driving circuit, and in particular to driving an electro-chromic display by effecting a transient characterized by an initial sharp increase in current and a subsequent slower decrease in current across the respective conductor electrodes of the electro-chromic display.

Heretofore, electro-chromic display driving circuits have been formed of MOS transistors in order to take advantage of the reduced power consumption which such MOS transistors provide. Nevertheless, the reduced power consumption characteristic of MOS transistors limits their effectiveness in obtaining sufficient contrast when utilized with electro-chromic display cells. Specifically, MOS transistors have a limited current capacity, and are designed to substantially suppress the transient currents, which render the level of coloring of the electro-chromic display cells less than completely satisfactory. Moreover, in order to obtain a better level of coloring of the electro-chromic display cells, when utilizing MOS transistors it is necessary to elevate the operating voltage applied to the respective display cells. Accordingly, the criteria for obtaining an improved electro-chromic digital display are not met by the use of MOS transistors.

SUMMARY OF THE INVENTION

Generally speaking, in accordance with the invention, an improved electro-chromic display driving circuit is provided. The electro-chromic display includes a first conductor adapted to be referenced to a first potential and a second conductor spaced apart from the first conductor and adapted to be referenced to a second potential or a third potential. The electro-chromic display further includes an oxidation-reduction sensitive compound disposed between the first and second spaced apart conductors. The compound is normally at a first level of transparency in response to a first predetermined potential difference between the first potential and the second potential, and is altered to a second level of transparency in response to a second predetermined potential difference between the third potential and the first potential. An injection type transistor circuit is coupled to the second conductor means and alternately and successively references the second conductor to the second and third potentials. The injection type transistor circuit improves the second level of transparency by effecting a transient characterized by an initial sharp increase in current and a subsequent slower decrease in current in response to second predetermined potential difference being applied across the first and second conductors.

Accordingly, it is an object of the instant invention to provide an electro-chromic display driving circuit including injection type transistors.

A further object of the instant invention is to provide improved contrast in an electro-chromic display.

Still a further object of the instant invention is to obtain improved contrast in electro-chromic displays without obtaining a corresponding increase in the operating voltage thereof.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a circuit diagram of a C-MOS transistor electro-chromic display driving circuit;

FIGS. 2a, 2b, 2c and 2d are waveforms illustrating the operation of the C-MOS electro-chromic display driving circuit depicted in FIG. 1;

FIG. 6 is a detailed circuit diagram of a bipolar transistor driving circuit for a 3-terminal electro-chromic display of the type depicted in FIG. 5; and FIGS. 7a and 7b are wave diagrams illustrating the operation of the 3-terminal electro-chromic display cell bipolar transistor driving circuit depicted in FIG. 6.

DETAILED DESCRIPTION OF THE PREFERRED EMBODIMENTS

Figure 3:
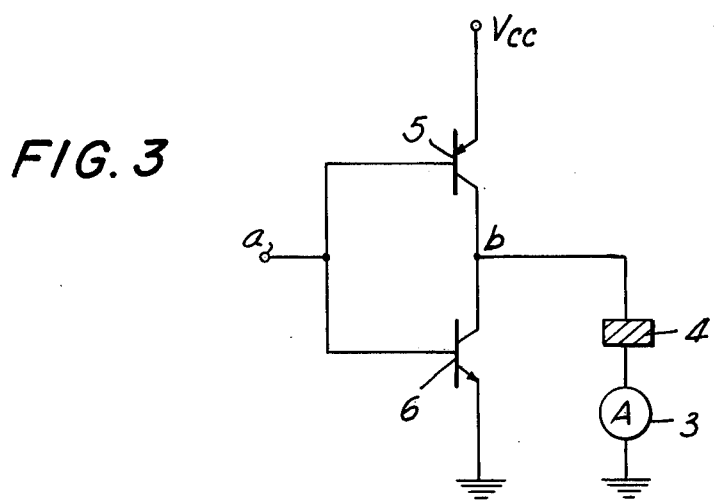
FIG. 3 is a bipolar transistor electro-chromic driving circuit constructed in accordance with the preferred embodiment of the instant invention.

Reference is now made to FIG. 1, wherein a C-MOS transistor driving circuit particularly suited for driving an electro-chromic display cell 4 is depicted. The electro-chromic display cell 4, also referred to herein as EC display cell 4, is of a conventional construction including a first anode conductor and second cathode conductor with an oxidation-reduction sensitive compound disposed between the respective first and second conductors. The EC display cell 4 includes an oxidation-reduction compound that is normally at a first transparent level when there is no voltage or current applied across the first and second conductors. When a potential difference is applied across the first and second conductors, the oxidation-reduction compound becomes colored, the degree of coloring being dependent on the magnitude of the potential difference between the first and second conductors. Once the potential difference across the first and second conductors is removed, the oxidation-reduction material is oxidized and returns to its normally transparent level.

Once again referring to the circuit depicted in FIG. 1, the driving circuit includes complementary coupled P-channel MOS transistor 1 and N-channel MOS transistor 2. The gate terminals of the P-channel and N-channel transistors are coupled together to define an input terminal $a$ and the drain terminals are coupled to define an output terminal, at the node $b$, which output terminal is coupled to a conductor (not shown) of the EC display 4. The respective source terminals of the P-channel transistor 1 and N-channel transistor 2 are respectively coupled to a positive drive voltage $V_{cc}$ and ground. The other conductor of the EC display cell 4 (not shown) is coupled through an ammeter 3 to ground.

In FIGS. 2a through 2d, the wave diagrams illustrate the operation of the EC display drive circuit of FIG. 1. The AC signal illustrated in FIG. 2a is applied to the drain input terminal a of the C-MOS drive circuit to alternately turn ON and OFF P-channel transistor 1 and N-channel transistor 2. When the AC signal applied to the input terminal a is in a LOW half cycle, the P-channel transistor 1 is turned ON and the N-channel transistor 2 is turned OFF, thereby providing a closed current path from the voltage source $V_{cc}$ through the source-drain path of the P-channel transistor 1, through the EC display cell 4 and the ammeter 3 to ground. Accordingly, the node b, as illustrated in FIG. 2b is at a HIGH potential when the input terminal a is at a LOW potential. Alternatively, when the AC drive signal is in a HIGH or positive half cycle, the P-channel transistor 1 is turned OFF and the N-channel transistor N is turned ON, thereby referencing node b to ground through the drain-source current path of the N-channel transistor 2, and accordingly, referencing both conductors or electrodes of the EC display cell 4 to ground potential.

As illustrated in FIG. 2c, when the source voltage $V_{cc}$ is applied to the EC display cell 4, a current transient illustrated by an increase to the current level $i_p$ and a subsequent slower decrease in the current to a zero level is effected across the conductors of the EC display cell. As illustrated in FIG. 2d, the current transient reduces the oxidation-reduction compound to a reduced level $L_P$ wherein the EC display cell 4 is colored, and continues to remain colored as long as the voltage $V_{cc}$ is applied thereto. Once a HIGH level signal is applied to the input terminal of the C-MOS transistor drive circuit, as described above, both conductors of the EC display cell 4 are referenced to ground, and the oxidation-reduction compound is oxidized to a transparent level $L_N$. It is noted that if the first conductor electrode is a front nesa film electrode and the second conductor electrode is a deposited silver film backing electrode, when the oxidation-reduction compound is in the oxidized level $L_n$, the reflection from the deposited silver film is viewed, and when the oxidation-reduction compound is reduced to the colored level $L_p$, absorption of the incident light increases and the strength of reflection decreases by comparison to the level $L_n$. Thus, the contrast between the transparent level and the colored level is determined by the difference in the reflection level $L_N$ and the color level $L_p$ obtained by the driving circuit, and as is illustrated in FIGS. 2c and 2d, the initial increase and subsequent decrease in the current transient is determinative of the degree of contrast between the respective reflection level and color level of the oxidation-reduction compound.

Figure 4A:
FIGS. 4a and 4b are wave forms illustrating the operation of the bipolar transistor electro-chromic display driving circuit depicted in FIG. 3.
Figure 4B:

Reference is now made to FIG. 3, wherein the C-MOS inverter circuit illustrated in FIG. 1 is replaced by a drive circuit comprised of PNP bipolar transistor 5 and NPN bipolar transistor 6, which transistors are injection type transistors having a larger current capacity than a MOS transistor. Accordingly, the base electrodes of the transistors 5 and 6 are coupled together to define an input terminal a, and the collector electrodes are coupled together to define an output terminal b. The emitter electrode of injection type bipolar transistor 5 is coupled to the voltage source $V_{cc}$ and the emitter electrode of the injection type bipolar transistor 6 is coupled to ground. Like reference numerals are utilized with respect to the remaining elements to denote like elements depicted in FIG. 1. FIG. 4a illustrates the current in the EC display cell 4 and FIG. 4b indicates the contrast between the transparent level $L_N$ and the colored level $L_P$ when the input terminal a of the drive circuit depicted in FIG. 3 is driven in the same manner described above with respect to FIG. 1. When compared with the flow of current illustrated in FIG. 2c, it is demonstrated that injection type transistors effect a current transient wherein the initial sharp increase in current is not as suppressed, and the subsequent slower decrease in current is nevertheless a faster decrease than that observed when MOS transistors are utilized. The sharp increase to a higher level $i_p$, as illustrated in FIG. 4b, clearly increases the contrast between the transparent level $L_N$ and color level $L_p$ illustrated in FIG. 4b.

It is noted that in order to elevate the contrast of the EC display cell 4 in the driving circuit depicted in FIG. 1 utilizing MOS transistors, there must be an increase in the operating voltage and an accompanying decrease in the operating speed in order to permit sufficient time for the level of cologing $L_p$ to be reached before the input level of the drive signal is changed. Nevertheless, when injection type bipolar transistors are utilized, the inherent structure thereof increases the current capacity and thereby effects the improved current transient without the necessity of elevating the operating voltage. Moreover, due to the rapid decrease in the current transient, the switching speed of the drive circuit can be increased. Thus, the instant invention is characterized by utilizing injection type bipolar transistors for driving EC display cells.

It is noted that the simple driving circuit depicted in FIG. 3 is particularly suited for driving EC display cells over short periods of time. Nevertheless, when it is necessary to drive a EC display cell for extended periods of time such as one year or more, more precise voltage control is required. This is particularly the case in two-terminal EC display cells of the type depicted in FIG. 3 since the oxidation-reduction compounds accumulate in the neighborhood of the anode and thereby increase the resistance and hence the voltage drop required to alter the levels of transparency of the oxidation-reduction compound. It is noted that the colored level of the EC display cell oxidation-reduction compound is obtained at the cathode, but at least a minimum potential difference between the cathode electrode and anode electrode with respect to the oxidation-reduction compound solution is required to reach such a colored level. Thus, a decrease in the voltage drop across the respective electrodes causes a likewise decrease in the color level attained, until finally, there is an insufficient potential difference to obtain any coloring at all. Accordingly, a three-terminal EC display cell, is utilized to avoid this occurrence.

Figure 5:
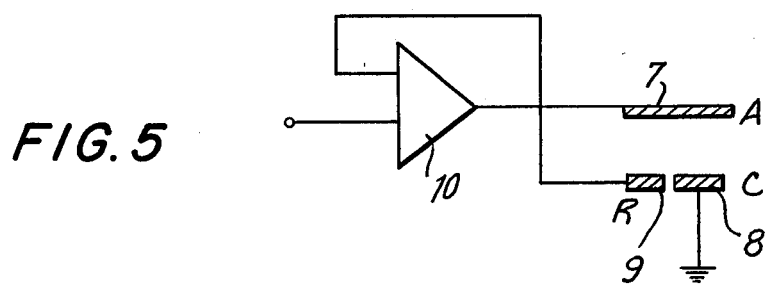
FIG. 5 is a circuit diagram of a 3-terminal electro-chromic display driving circuit constructed in accordance with a further embodiment of the instant invention.

Referring specifically to FIG. 5, a 3-terminal EC display cell is depicted. In order to insure that there is a constant potential difference between the oxidation-reduction compound and cathode electrode 9, a reference electrode 9 is disposed proximate to a cathode electrode 8 and spaced apart from an anode electrode 7. The anode electrode 7 is driven by an amplifier 10 formed by bipolar injection type transistors, and includes a feedback input from the reference electrode 9.

Referring now to FIG. 6, an example of an injection type bipolar transistor drive circuit for driving the three-terminal EC display cell depicted in FIG. 5 is illustrated. The anode potential applied to the anode electrode A is fed back as a reference potential through the reference electrode R to subsequently control the bipolar transistor $T_4$ after each control signal is applied to the input transistor $T_1$. The input transistor $T_1$ controls transistor $T_2$, and the reference electrode transistor $T_4$ controls the transistor $T_3$. Transistors $T_1$ through $T_4$ are coupled in a flip-flop circuit arrangement so that transistors $T_1$ and $T_2$ are turned ON when transistors $T_3$ and $T_4$ are turned OFF and, alternatively, transistors $T_3$ and $T_4$ are turned ON, transistors $T_1$ and $T_2$ are turned OFF, when a triangular waveform, of the type depicted in FIG. 7a, is applied to the INPUT thereof. Transistors $T_5$ and $T_6$ are respectively controlled by the transistors $T_2$ and $T_3$, to thereby apply an alternating drive signal to the anode drive transistors $T_7$ and $T_8$. The triangular wave form $e$ illustrated in FIG. 7a is applied to the input of the transistor $T_1$ and in response thereto, a transient current $f$ illustrated in FIG. 7b is effected at the anode electrode A to provide a very sharp contrast to the EC display.

Specifically, when the potential of the triangular wave form $e$ applied at the input to the transistor $T_1$ is at a HIGH level, the transistor $T_1$ is turned ON, thereby also turning ON transistor $T_2$ and hence transistor $T_6$. Accordingly, when transistor $T_6$ is turned on, transistor $T_7$ is turned ON and references the anode electrode A to the positive potential V+, resulting in a first potential difference across the anode A and cathode and an initial sharp increase in the current transient in the EC display cell. The reference electrode R detects the voltage across the anode and cathode electrodes effecting the sharp current transient, and in response thereto controls the transistor $T_3$, which transistor in turn turns ON transistor $T_5$, which transistor thereby couples the positive voltage source V+ to ground. At the same time, the change from a HIGH level to a LOW level by the input signal $e$ effects a turning OFF of the transistor $T_1$ and accordingly a further turning OFF of the transistors $T_2$ and $T_6$. Accordingly, the commonly coupled base electrodes of the anode driving transistors $T_7$ and $T_8$ are then controlled by the negative voltage source V- and thereby turn ON transistor $T_8$ to reference the anode electrode A to the negative potential V- and provide a second predetermined potential difference of an opposite polarity across the anode and cathode electrodes of the display cell. By reversing the polarity of the potential difference between the anode and cathode of the display cell, a rapid decrease in the transient current to a second opposite level peak is effected, thereby optimizing the contrast level of the EC display cell.

Accordingly, as illustrated in FIGS. 3 and 6, the instant invention is characterized by utilizing injection type bipolar transistors in the driving circuit for driving the EC display cells, the injection type bipolar transistors providing greater contrast in the display cell without increasing the operating voltage. It is noted that this result is also obtained when the driving circuit is formed of injection type $I_2L$ instead of bipolar transistors. By utilizing injection type transistors, sufficient contrast in the EC display cells is obtained to render their use in small-sized electronic instruments having digital displays particularly desirable.

It will thus be seen that the objects set forth above, among those made apparent from the preceding description, are efficiently attained and, since certain changes may be made in the above constructions without departing from the spirit and scope of the invention, it is intended that all matter contained in the above descriptions or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A display driving circuit comprising in combination electro-chromic display means comprising a first conductor means adapted to be referenced to a first potential, and second conductor means spaced apart from said first conductor means and adapted to be referenced to one of a second potential and a third potential, wherein said third potential is greater than said first potential, and said second potential is less than said first potential, and an oxidation-reduction sensitive compound disposed between said first and second spaced apart conductor means, said compound being normally at a first level of transparency in response to a first predetermined potential difference between said first potential and said second potential, and being altered to a second level of transparency in response to a second predetermined potential difference between said third potential and said first potential, and injection type transistor means for alternately and successively applying said second and third potential to said second conductor means, said injection transistor means effecting a transient characterized by an initial sharp increase in current in response to said first predetermined potential difference and a sharp negative decrease to a negative value following said initial sharp increase from a zero level, followed in turn by a return to a zero level, in response to said second predetermined potential difference.

2. A display dirving circuit as claimed in claim 1, wherein said injection type transistor means includes a first bipolar transistor and a second bipolar transistor said first and second bipolar transistors having their respective emitter electrodes coupled to said second spaced apart conductor means, and having commonly coupled base electrodes for defining a control terminal for alternately turning ON said first and second bipolar transistors to thereby alternately reference said second conductor means to one of said second and third potentials.

3. A display driving circuit as claimed in claim 2, wherein said display cell includes a reference conductor means disposed proximate to said first conductor means and spaced apart from said second conductor means, said reference conductor means being coupled to said transistor means for insuring that said second potential is applied to said second conductor means subsequent to and in response to said third potential being applied to said second conductor means.

4. A display driving circuit as claimed in claim 3, wherein said second potential level is less than said first potential level, and said third potential is greater than said first potential, so that said first predetermined potential difference is of an opposite polarity than said second predetermined potential difference said current being further characterized by a sharp negative decrease to a negative value following said initial sharp increase, said initial sharp increase being from a zero level, followed in turn by a return to a zero level.

5. A display driving circuit as claimed in claim 4, wherein the collector electrode of said first bipolar transistor is coupled to a potential source having a potential substantially equal to said third potential, and said second bipolar transistor collector electrode is coupled to a potential source having a voltage substantially equal to said second potential, and flip-flop means intermediate said reference conductor means and switching means coupled intermediate said reference conductor means and said commonly coupled bipolar transistor base electrodes for initially turning ON said first bipolar transistor to thereby couple said third potential to said second conductor means, said reference conductor means being adapted to detect said second predetermined potential difference occasioned thereby and in response thereto being adapted to control said switching means to turn ON said second bipolar transistor and thereby reference said second conductor means to said second potential and thereby apply said first predetermined potential difference across said respective first and second control conductor means.

6. A display driving circuit as claimed in claim 5, wherein said switching means include input transistor means for receiving a triangular input signal, said input transistor means in response to a first level of said triangular input signal turning ON said first bipolar transistor and in response to the opposite level of said triangular input signal being adapted to turn OFF said first bipolar transistor.

7. A display driving circuit as claimed in claim 6, wherein said reference conductor means is adapted to detect said first predetermined potential difference across said first and second conductor means and in response thereto control said switching means to permit said switching means in response to the next first level of the triangular wave form applied thereto to turn said first bipolar transistor ON and turn said second bipolar transistor OFF.

8. A display driving circuit comprising in combination electro-chromic display means comprising a first electrode means adapted to be referenced to a first potential, second electrode means spaced apart from said first electrode means and adapted to be referenced to one of a second potential and a third potential, and a reference electrode means disposed proximate to said first electrode means and spaced apart from said electrode means, and an oxidation-reduction sensitive compound disposed between said second and said first and said reference spaced apart electrode means, said compound being normally at a first level of transparency in response to a first predetermined potential difference between said first potential and said second potential, and being altered to a second level of transparency in response to a second predetermined potential difference between said third potential and said first potential, and circuit means for alternately and successively applying second and third potentials to said second conductor means, said circuit means being coupled to said reference electrode means for detecting said second predetermined potential difference and being controlled thereby to subsequently reference said second electrode means to a second potential subsequent to an in response to a referencing of said second electrode means to said third potential.

9. A display driving circuit as claimed in claim 8, wherein said second potential level is less than said first potential level, and said third potential level is greater than said first potential, so that said first predetermined potential difference is of an opposite polarity than said second predetermined potential difference, said circuit means effecting a current transient across said spaced apart conductor electrode means in response to the alternate and successive application of said second and third potential levels to said second electrode means characterized by an initial sharp increase in current from a zero level followed by a sharp negative decrease to a negative value, followed in turn by a return to a zero level.

* * * * *